(12) United States Patent
Kang

(10) Patent No.: US 8,421,144 B2
(45) Date of Patent: Apr. 16, 2013

(54) ELECTRICALLY ERASABLE PROGRAMMABLE READ-ONLY MEMORY AND MANUFACTURING METHOD THEREOF

(75) Inventor: Jin-Yeong Kang, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 384 days.

(21) Appl. No.: 12/796,840

(22) Filed: Jun. 9, 2010

(65) Prior Publication Data

US 2011/0140189 A1  Jun. 16, 2011

(30) Foreign Application Priority Data

Dec. 10, 2009 (KR) .................. 10-2009-0122676

(51) Int. Cl.
*H01L 29/788* (2006.01)
(52) U.S. Cl.
USPC .. 257/317; 257/316; 257/E29.3; 257/E21.68; 438/257; 438/593
(58) Field of Classification Search .................. None
See application file for complete search history.

(56) References Cited

U.S. PATENT DOCUMENTS

| | | | |
|---|---|---|---|
| 4,462,090 A | 7/1984 | Iizuka | |
| 5,291,439 A | 3/1994 | Kauffmann et al. | |
| 5,293,328 A | 3/1994 | Amin et al. | |
| 5,395,779 A * | 3/1995 | Hong | 438/263 |
| 5,402,371 A | 3/1995 | Ono | |
| 5,614,429 A | 3/1997 | Shin et al. | |
| 5,679,970 A | 10/1997 | Hartmann | |
| 5,712,180 A | 1/1998 | Guterman et al. | |
| 5,856,943 A | 1/1999 | Jeng | |
| 6,054,350 A * | 4/2000 | Hsieh et al. | 438/261 |
| 6,111,788 A | 8/2000 | Chen et al. | |
| 6,218,246 B1 | 4/2001 | Kwon | |
| 6,391,717 B1 * | 5/2002 | Shin et al. | 438/257 |
| 2004/0266199 A1 * | 12/2004 | Lee | 438/705 |
| 2007/0148844 A1 * | 6/2007 | Ko | 438/197 |
| 2009/0194806 A1 | 8/2009 | Nam | |

FOREIGN PATENT DOCUMENTS

| | | |
|---|---|---|
| KR | 10-1999-0015597 A | 3/1999 |
| KR | 1020040084139 A | 10/2004 |
| KR | 1020050030456 A | 3/2005 |
| KR | 1020050120297 A | 12/2005 |

OTHER PUBLICATIONS

Fujio Masuoka et al., "A New Flash E²Prom Cell using Triple Polysilicon Technology," IEDM, 1984, pp. 464-467, IEDM.

* cited by examiner

*Primary Examiner* — Tan N Tran
*Assistant Examiner* — Scott R Wilson

(57) ABSTRACT

An electrically erasable programmable read-only memory includes a first polysilicon layer, a second polysilicon layer and a third polysilicon layer, the first polysilicon layer and the third polysilicon layer forming a control gate and the second polysilicon layer forming a floating gate. The first polysilicon layer is horizontally disposed in series with the second polysilicon layer and is connected to the third polysilicon layer, so that the control gate encloses all of the floating gate except for a tunnel surface of the floating gate.

16 Claims, 14 Drawing Sheets

CONVENTIONAL CONFIGURATION (AREA: 80,400nm², COUPLING RATIO: 72%)

INVENTIVE CONFIGURATION (AREA: 80,400nm$^2$, COUPLING RATIO: 84%)

ELECTRICALLY ERASABLE PROGRAMMABLE READ-ONLY MEMORY AND MANUFACTURING METHOD THEREOF

CROSS-REFERENCE(S) TO RELATED APPLICATION

The present invention claims priority of Korean Patent Application No. 10-2009-0122676, filed on Dec. 10, 2009, which is incorporated herein by reference.

FIELD OF THE INVENTION

The present invention relates to a technique for manufacturing a semiconductor, and particularly to an electrically erasable programmable read-only memory (EEPROM) and a manufacturing method thereof in which a coupling ratio is increased in a same area thus enabling low-voltage operation thereof during programming/erasing and also in which a control gate connected in series to a floating gate is used to self-control the generation of excessive channel hot-electron (CHE) current upon programming and to suppress generation of initial leakage current resulting by a previous over-erase even if high voltage drain is not floated, whereby self-stabilizing operation of the EEPROM.

BACKGROUND OF THE INVENTION

In general, EEPROM cells in a semiconductor device exhibit non-volatile properties capable of retaining data stored therein even when the supply of power is interrupted. Also, each of the EEPROM cells has a floating gate for storing the data. The floating gate is electrically isolated and stores electric charges therein. The data stored in an EEPROM cell may be classified into logic "1" and logic "0" data depending on an amount of electric charges stored in the floating gate.

Recently, flash ROM is based on such EEPROM. With the conventional EEPROM it is difficult to attain a high coupling ratio in proportion to an increase in its density, and thus requires high operating voltage for programming/erasing and needs a sophisticated electronic circuit using a time division procedure which is temporally precise and an intermediate verification algorithm for stable operation.

FIG. 1 is a cross-sectional view showing a conventional EEPROM.

With reference to FIG. 1, the conventional EEPROM 100 includes two layers of polysilicon (poly-Si) manufactured at high yield through a simple process. The EEPROM 100 uses a high voltage of about 18V during programming/erasing and thus a solution for preventing excessive current generation during programming/erasing is needed, such as additional current limitation, terminal floating and the like. However, owing to sophisticated peripheral circuits and supply of high operating voltage, the manufacturing process of an EEPROM becomes simple and an area thereof gets reduced, whereby the EEPROM is widely employed in large-capacity chips.

As mentioned above, conventional EEPROM used in a small-scale for embedded system-on-chip (SoC) applications such as a smart card or a typical electronic apparatus should include an additional sophisticated electronic circuit to ensure a high operating voltage and stable operation thereof, but such an additional electronic circuit is complicated to be implemented and adopted.

SUMMARY OF THE INVENTION

Therefore, the present invention provides an EEPROM and a manufacturing method thereof in which a control gate is formed to enclose a floating gate except for the lower tunnel surface thereof to increase a coupling ratio in a same area thereby enabling low-voltage operation.

In accordance with a first aspect of the present invention, there is provided an electrically erasable programmable read-only memory, comprising a first polysilicon layer, a second polysilicon layer and a third polysilicon layer, the first polysilicon layer and the third polysilicon layer forming a control gate and the second polysilicon layer forming a floating gate, wherein the first polysilicon layer is horizontally disposed in series with the second polysilicon layer and is connected to the third polysilicon layer, so that the control gate encloses all of the floating gate except for a tunnel surface of the floating gate.

In accordance with a second aspect of the present invention, there is provided an electrically erasable programmable read-only memory, including: a device isolation film disposed on a predetermined region of a semiconductor substrate to define active regions; a well layer formed on a surface of the semiconductor substrate having the device isolation film through ion implantation; a first layer of a control gate formed by sequentially forming a gate oxide film and polysilicon on an electrically erasable programmable read-only memory region on which the well layer has been formed and then patterning them; a second layer of a floating gate formed to be horizontally disposed in series on the first layer of the control gate; and a third layer of a control gate formed to be horizontally disposed on the second layer of the floating gate and connected to the first layer of the control gate to enclose the second layer of the floating gate.

In accordance with a third aspect of the present invention, there is provided a method for manufacturing an electrically erasable programmable read-only memory.

The method includes: forming a device isolation film on a p-type semiconductor substrate; forming a well layer on a surface of the p-type semiconductor substrate having the device isolation film through ion implantation; sequentially forming a gate oxide film and polysilicon on an electrically erasable programmable read-only memory region having the well layer, and patterning them to thereby form a first layer of a control gate; forming a second layer of a floating gate to be horizontally disposed on the first layer of the control gate; forming a third layer of the control gate to be horizontally disposed on the second layer of the floating gate; and connecting the first layer of the control gate and the third layer of the control gate to each other to enclose the second layer of the floating gate.

In accordance with the aspects of the present invention, the EEPROM apparatus is configured such that a control gate is formed to enclose all of a floating gate except for the lower tunnel surface of the floating gate. Hence, the coupling ratio is increased from about 72% to about 84% on the same area and the low-voltage operation becomes possible. Specifically, the coupling ratio may be increased on the same area and the area may be reduced by 50% at the same coupling ratio. Actually, such a high coupling ratio is applied, so that the voltage upon programming/erasing is decreased to about 12 V from the conventional 18 V, thus enabling the low-voltage operation.

The EEPROM in accordance with the present invention is configured such that the control gate is horizontally connected in series to the drain of the floating gate in the first polysilicon layer positioned at the bottom surface, and thus upon programming the generation of excessive CHE current may be controlled by the controlling action of the control gate.

Upon erasing, the control gate may prevent the generation of initial leakage current from the drain of the floating gate to the source when the floating gate transistor is "off" without floating the drain of the floating gate even in an over-erase state.

Therefore, thanks to the action of the control gate, the operational mode becomes simple and the operation is self-stabilized upon programming/erasing, whereby the peripheral circuit is simplified. Accordingly, the EEPROM in accordance with the present invention is easily adapted for embedded SoC applications, such as a smart card or an electronic apparatus, requiring a small amount of EEPROM.

BRIEF DESCRIPTION OF THE DRAWINGS

The above and other objects and features of the present invention will become apparent from the following description of embodiments, given in conjunction with the accompanying drawings, in which.

DETAILED DESCRIPTION OF THE EMBODIMENTS

Hereinafter, embodiments of the present invention will be described in detail with reference to an accompanying drawings form a part hereof.

Figure 1:
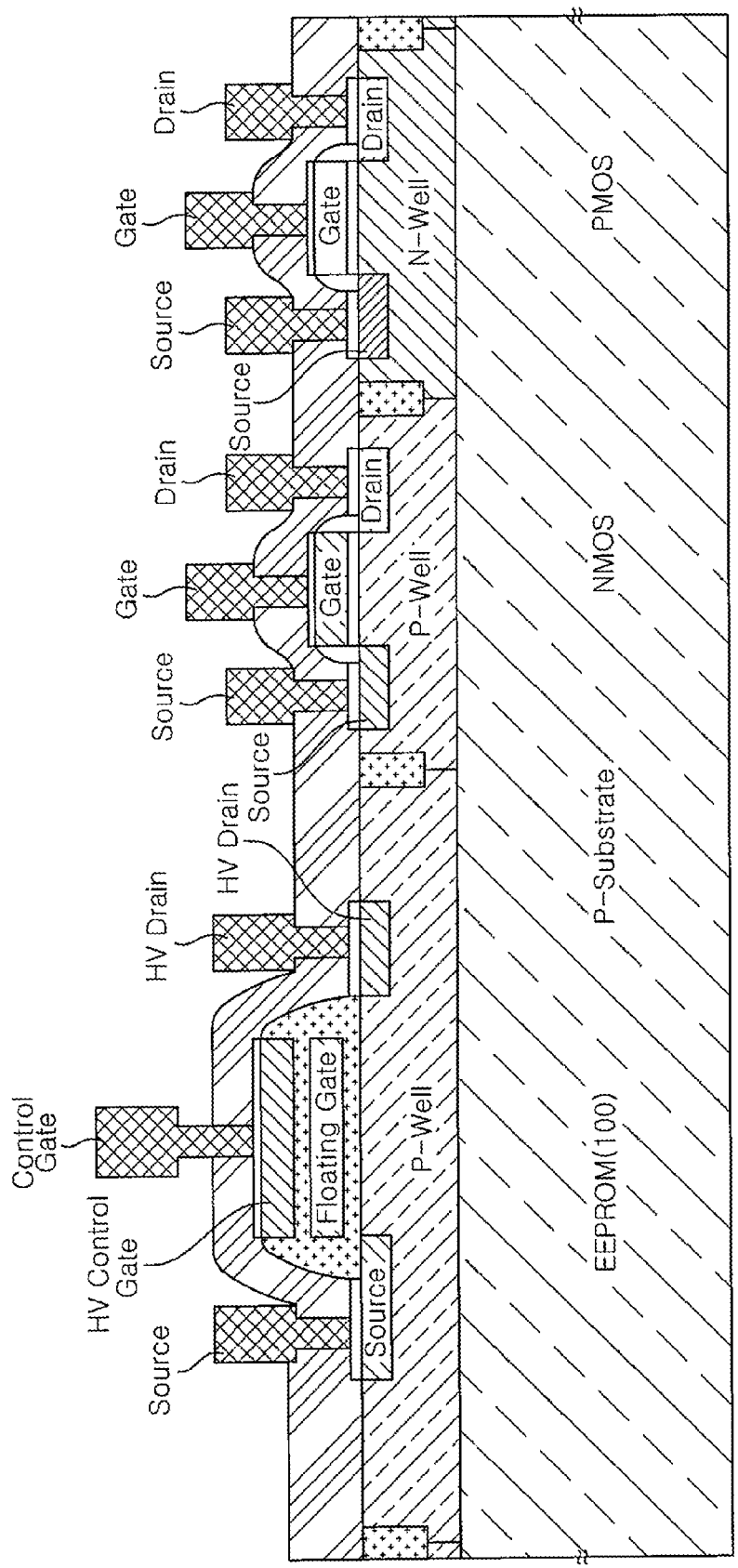
FIG. 1 is a cross-sectional view showing a conventional EEPROM.
Figure 2A:
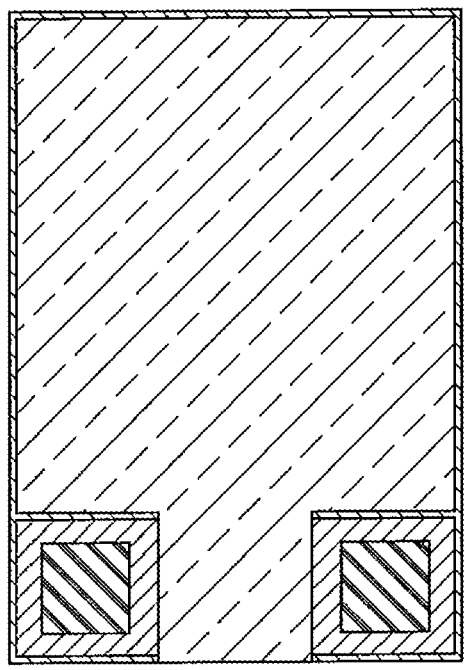
FIGS. 2A and 2B show layouts of same areas in the conventional EEPROM and an EEPROM in accordance with the present invention, and coupling ratios thereof.
Figure 2B:
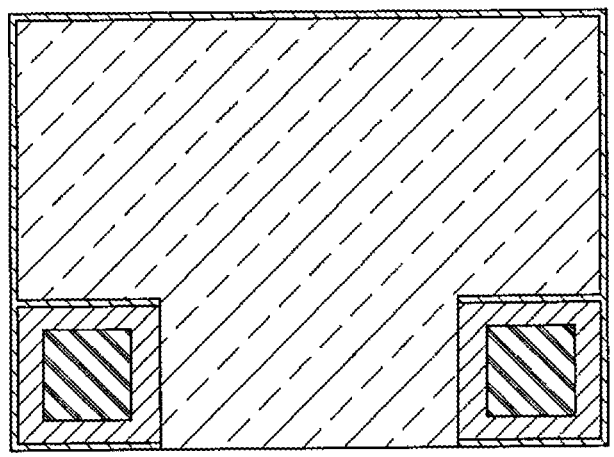

FIGS. 2A and 2B show layouts of same areas in the conventional EEPROM and an EEPROM in accordance with the present invention and coupling ratios thereof.

As shown in FIGS. 2A and 2B, the coupling ratios between a control gate and a floating gate of the configuration of the conventional EEPROM and that of the EEPROM in accordance with the present invention in a same area of 80,400 nm$^2$ are 72% and 84% respectively. The EEPROM configuration in accordance with the present invention exhibits the area reduction effect of 50% compared to the conventional configuration at a same coupling ratio.

FIGS. 3A to 3M sequentially show an EEPROM manufacturing process in accordance with the embodiment of the present invention.

Figure 3A:
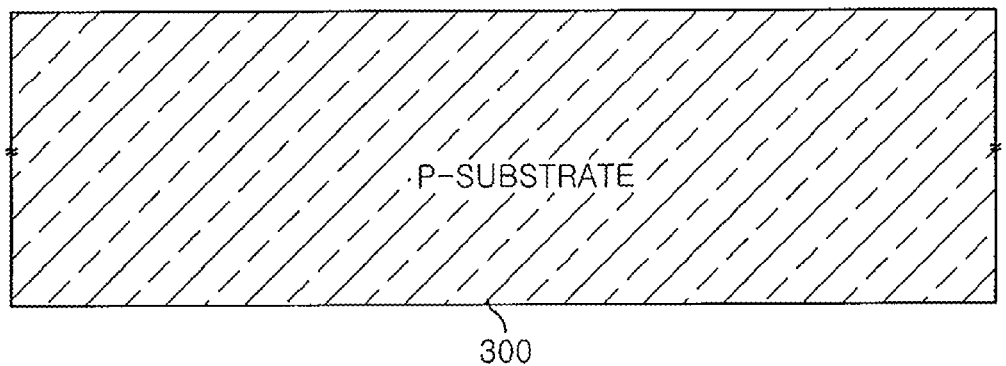
FIGS. 3A to 3M are cross-sectional views sequentially showing a manufacturing process of an EEPROM in accordance with the embodiment of the present invention.
Figure 3B:
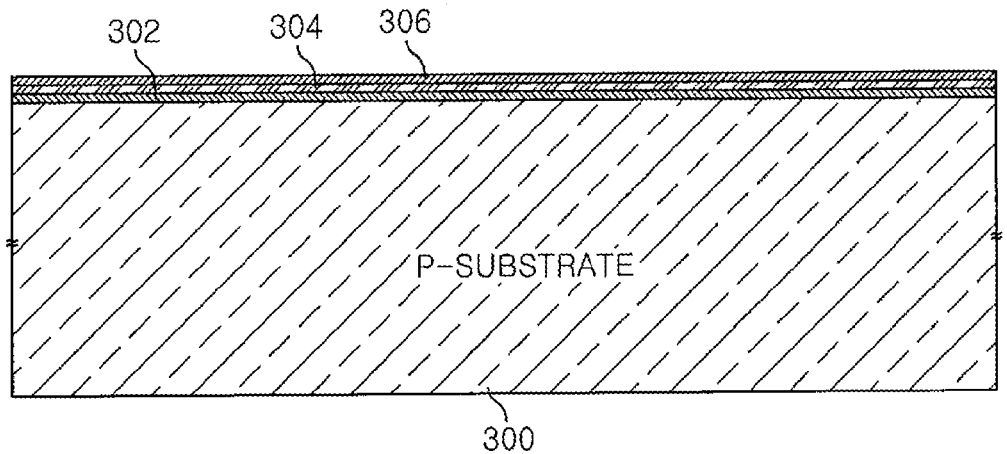

As shown in FIG. 3A, a p-type semiconductor substrate 300 which is a silicon wafer is doped with boron (B) ions in a range from 6 to 25 Ωcm. Subsequently, as shown in FIG. 3B, a buffer pad oxide film ($SiO_2$) 302 is formed on the substrate 300 before forming a trench structure 308 for device isolation, and a nitride film ($Si_3N_4$) 304 is formed on the pad oxide film 302 to facilitate stop control upon chemical mechanical polishing (CMP). Further, an oxide film 306 serving as a masking film is applied on the nitride film 304 to facilitate the patterning of the nitride film 304. Here, the pad oxide film 302 and the nitride film 304 are commonly known as insulating films.

Figure 3C:
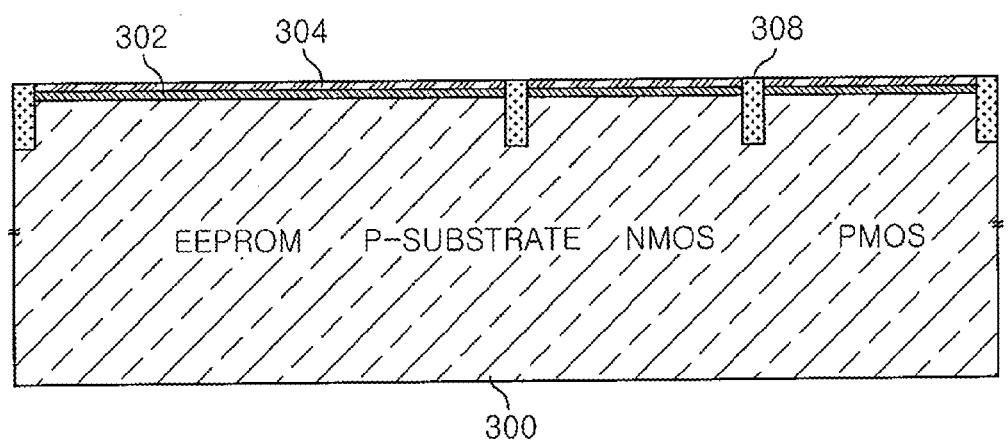

Next, as shown in FIG. 3C, exposure and development are performed using the oxide film 306 as the masking film thus forming a pattern which exposes the nitride film 304 on a trench region serving as a device isolation film. Then, the nitride film 304, the pad oxide film 302 and the p-type wafer 300 of the trench region are etched through wet etching and reactive ion etching. Thereafter, an inner wall of the trench is thermally oxidized, and then coated with an oxide film to fill gaps in the trench.

The oxide film other than the trench region is subjected to CMP and thus flattened by using the etching stop properties of the nitride film 304, and the nitride film 304 is etched through a nitrite stripping process. Thereafter, the applied trench oxide film becomes highly dense through thermal processing, thus completing the thin trench structure 308 for device isolation. The pad oxide film 302 remaining on the substrate 300 is removed by etching.

Figure 3D:
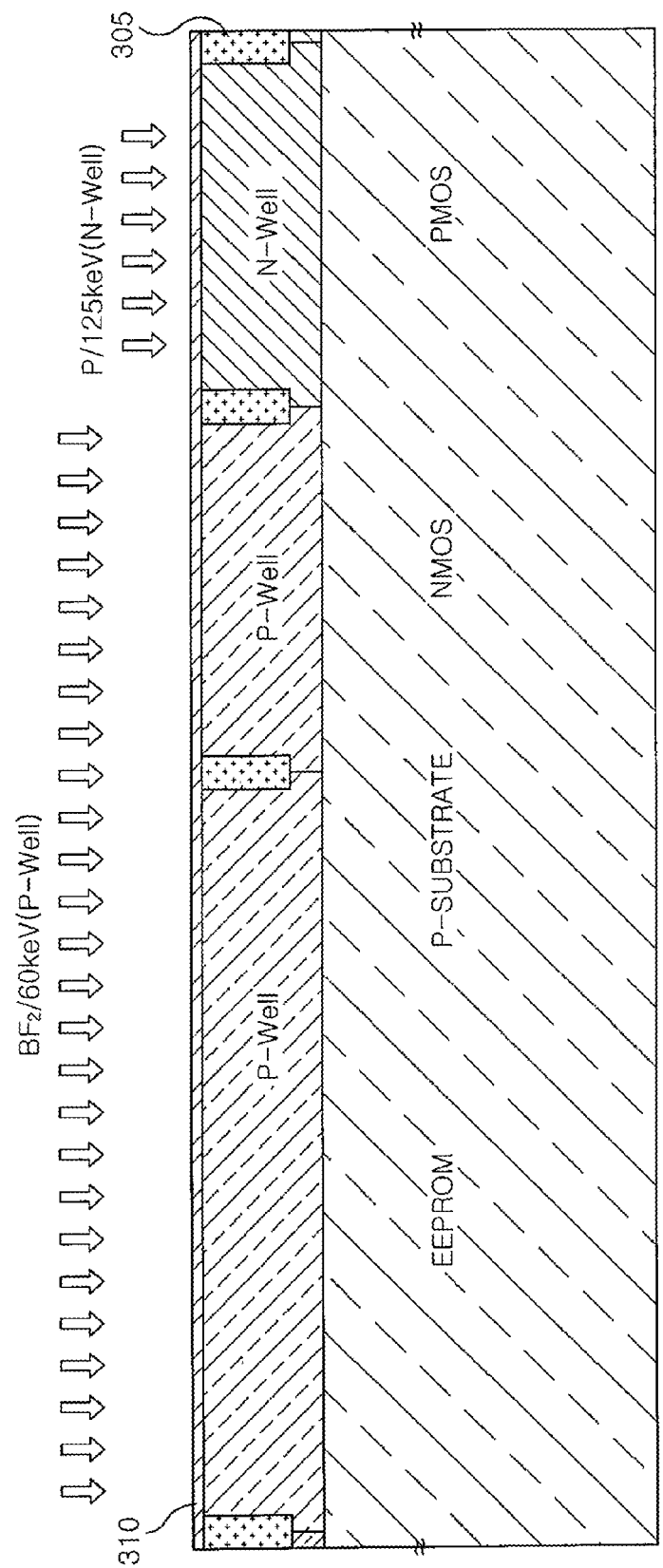

Next, as shown in FIG. 3D, in order to form the active layer of a device, the surface of the device is thermally oxidized, thus forming a protective film 310, and then a well layer 305 is formed through ion implantation. The well layer 305 of an n-type metal-oxide semiconductor (NMOS) region is formed through, ion implantation using boron ($BF_2$ ions are implanted with an energy of about 50 to 70 keV, preferably 60 keV), and A well layer of a p-type metal-oxide semiconductor (PMOS) region is formed through ion implantation using phosphorus (P) (with an energy of 110 to 140 keV, preferably 125 keV). The ion-implanted layer is then subjected to a drive-in process to have an appropriate depth in a range from 1 to 3 μm, after which the protective film 310 is removed.

Figure 3E:
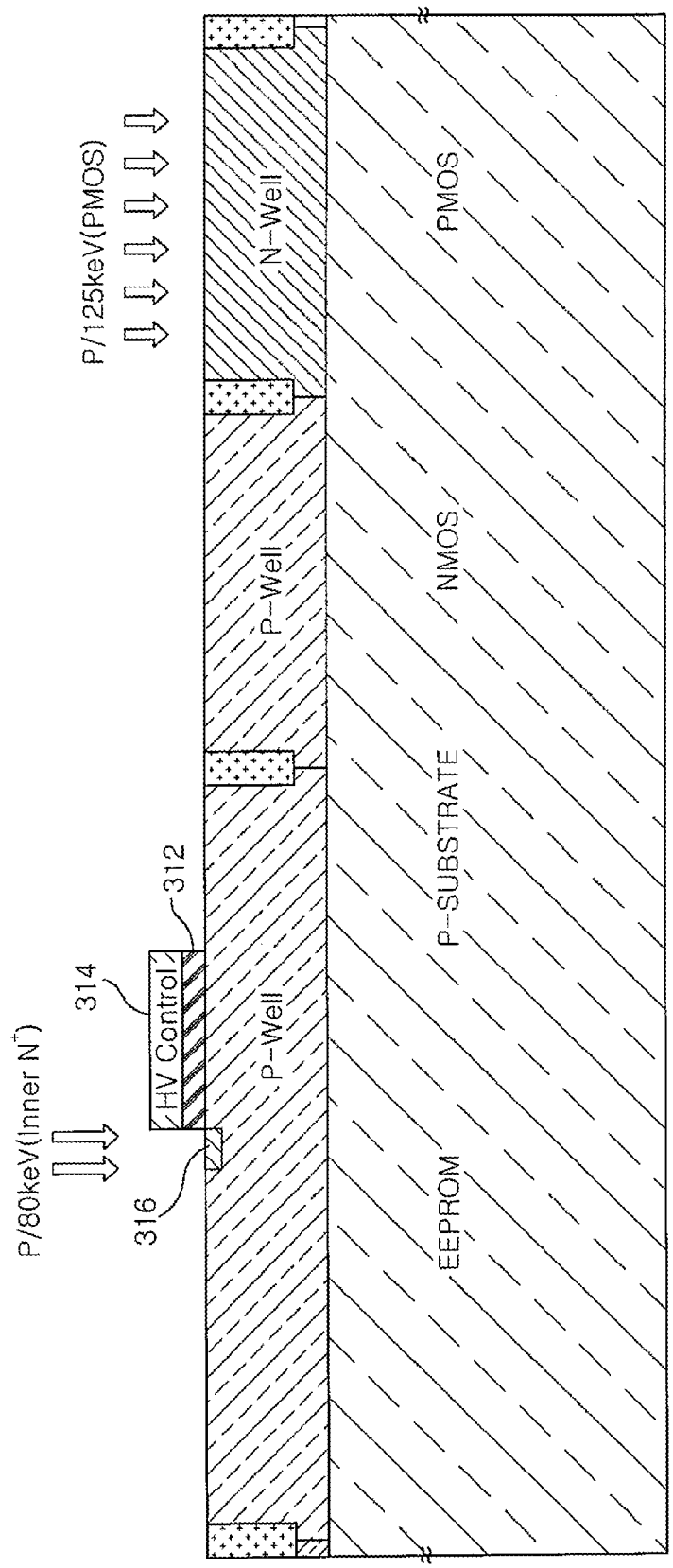

Next, as shown in FIG. 3E, a high-voltage gate oxide film 312 is formed on the p-well layer of the EEPROM region, and a control gate polysilicon layer is formed on the gate oxide film 312 through Low-Pressure Chemical Vapor Deposition (LPCVD), and is then patterned to form a first polysilicon layer as a control gate 314. Also, an inner N+ layer 316 for series channel connection is formed by ion implantation (P ions are implanted with an energy of about 70 to 90 keV, preferably 80 keV), into the p-well and a drive-in process is performed thereafter.

The PMOS region is subjected to ion implantation (P ions are implanted with an energy of about 110 to 140 keV, preferably 125 keV), and finally, the high-voltage gate oxide film 312 on an unnecessary region is removed.

Figure 3F:
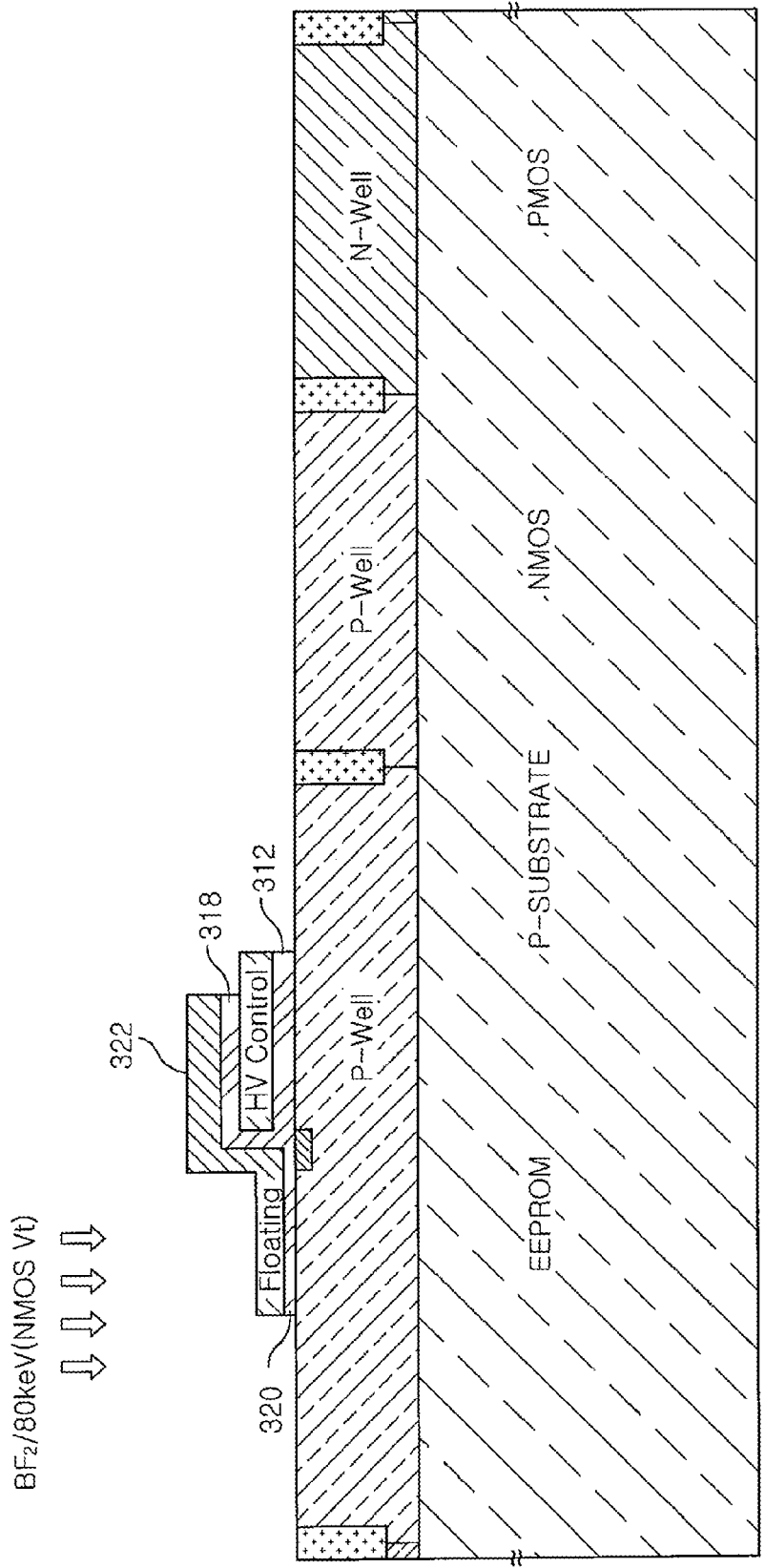

Then, as shown in FIG. 3F, formed on the p-well layer in the EEPROM region including the first polysilicon layer of the control gate 314 is a first ONO layer ($SiO_2/Si_3N_4/SiO_2$) 318 as a dielectric film through LPCVD. Herein, oxide/nitride/oxide of the first ONO layer 318 has a thickness of about 150 Å/70 Å/50 Å. Thereafter, ion implantation ($BF_2$ ions are implanted with an energy of about 70 to 90 keV, preferably 80 keV) is carried out in order to control the threshold voltage Vth of the floating gate. Thereafter, the first ONO layer 318 formed on a tunnel region is removed to form a tunnel oxide film 320 thereon through thermal oxidation. The tunnel oxide film 320 may be formed of $SiO_2$ or SiON and may have a thickness of about 50 to 100 Å. Thereafter, a second polysilicon layer 322 as a floating gate is formed on the tunnel oxide film 320 and the first ONO layer 318 through LPCVD. Thereafter, the first ONO layer 318 on an unnecessary region is removed.

Figure 3G:
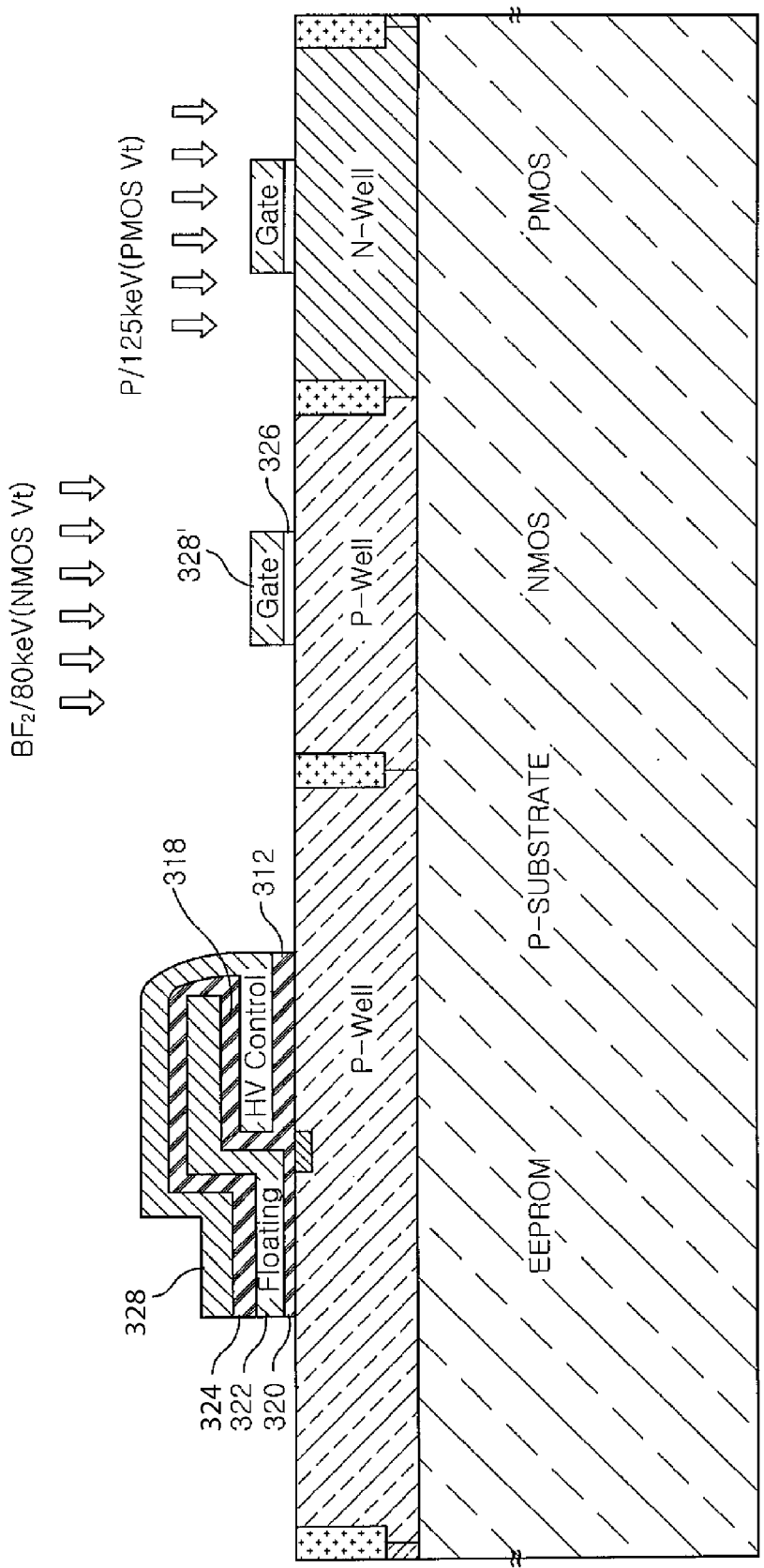

Then, as shown in FIG. 3G, a second ONO layer 324 is formed as a dielectric film on the second polysilicon layer 322, and the second ONO layer 324 formed on a CMOS region (i.e., the NMOS AND PMOS regions, on the p-type semiconductor substrate 300) is removed therefrom. Thereafter a gate oxide film 326 for CMOS is formed through thermal oxidation.

Then, the CMOS region, i.e., the NMOS and PMOS regions is subjected to ion implantation (the p-well layer is subjected to implantation of $BF_2$ ions with an energy of about 70 to 90 keV, preferably 80 keV, and the n-well layer is subjected to implantation of P ions with an energy of about 110 to 140 keV, preferably 125 keV) in order to control threshold voltage. Thereafter, a drive-in process is performed, and polysilicon 328' is formed on an entire surface of the EEPROM and CMOS regions through LPCVD.

Specifically, formed on the CMOS region is polysilicon 328' for a gate through LPCVD, and simultaneously formed on the second ONO layer 324 of the EEPROM region is a third polysilicon layer as a control gate 328 formed to enclose the floating gate. Thereafter, the gate oxide film 326 and the second ONO layer 324 on the unnecessary region are removed.

Figure 3H:
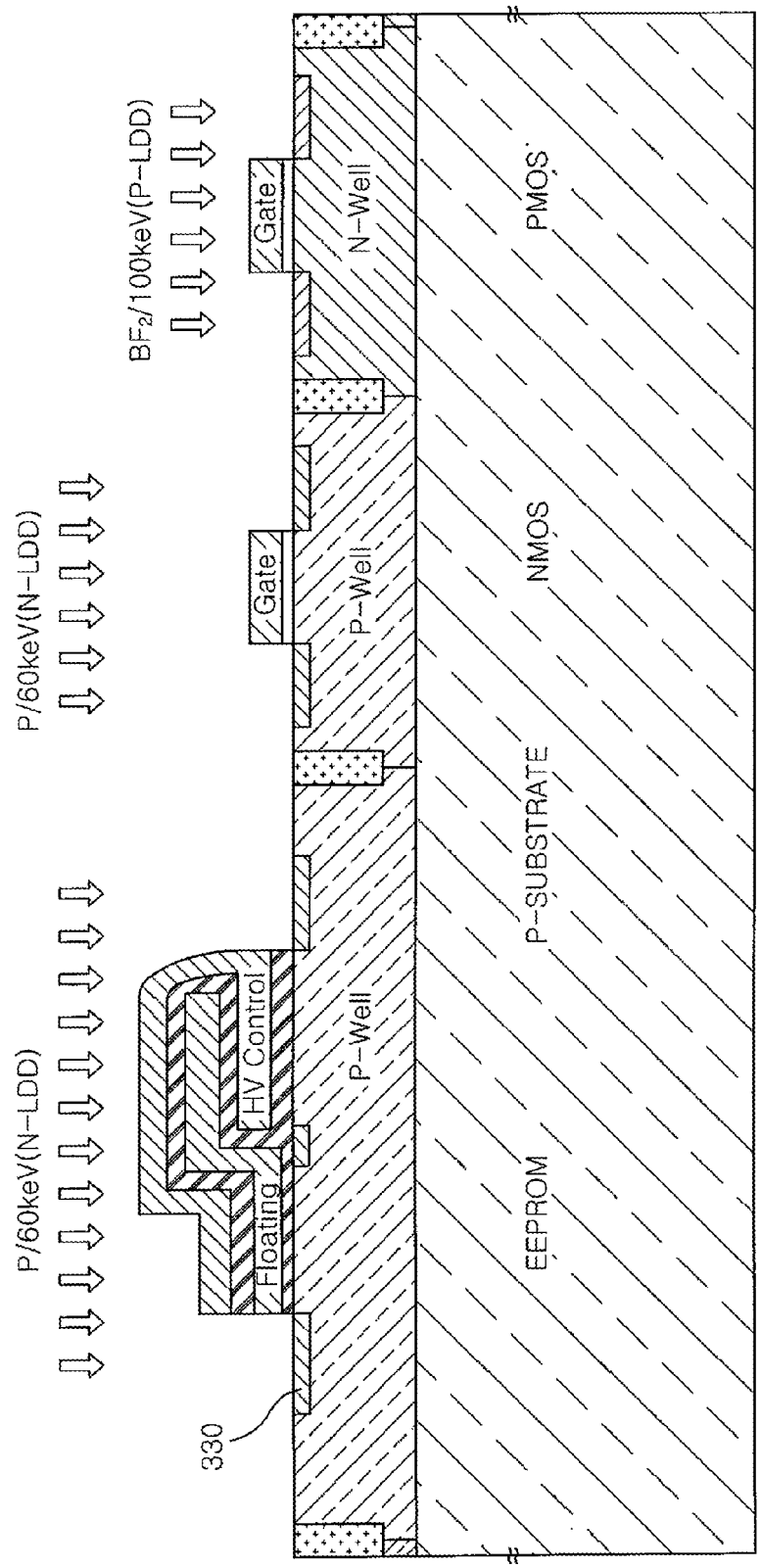

Next, as shown in FIG. 3H, in order to increase breakdown voltage of the source and drain regions of the EEPROM and CMOS and to inhibit generation of a hot carrier, a lightly doped drain (LDD) region 330 is formed through low-concentration ion implantation (i.e., the p-well region is subjected to implantation of P ions with an energy of about 50 to 70 keV, preferably 60 keV, and the n-well region is subjected to implantation of $BF_2$ ions with an energy of about 90 to 110 keV, preferably 100 keV).

Figure 3I:
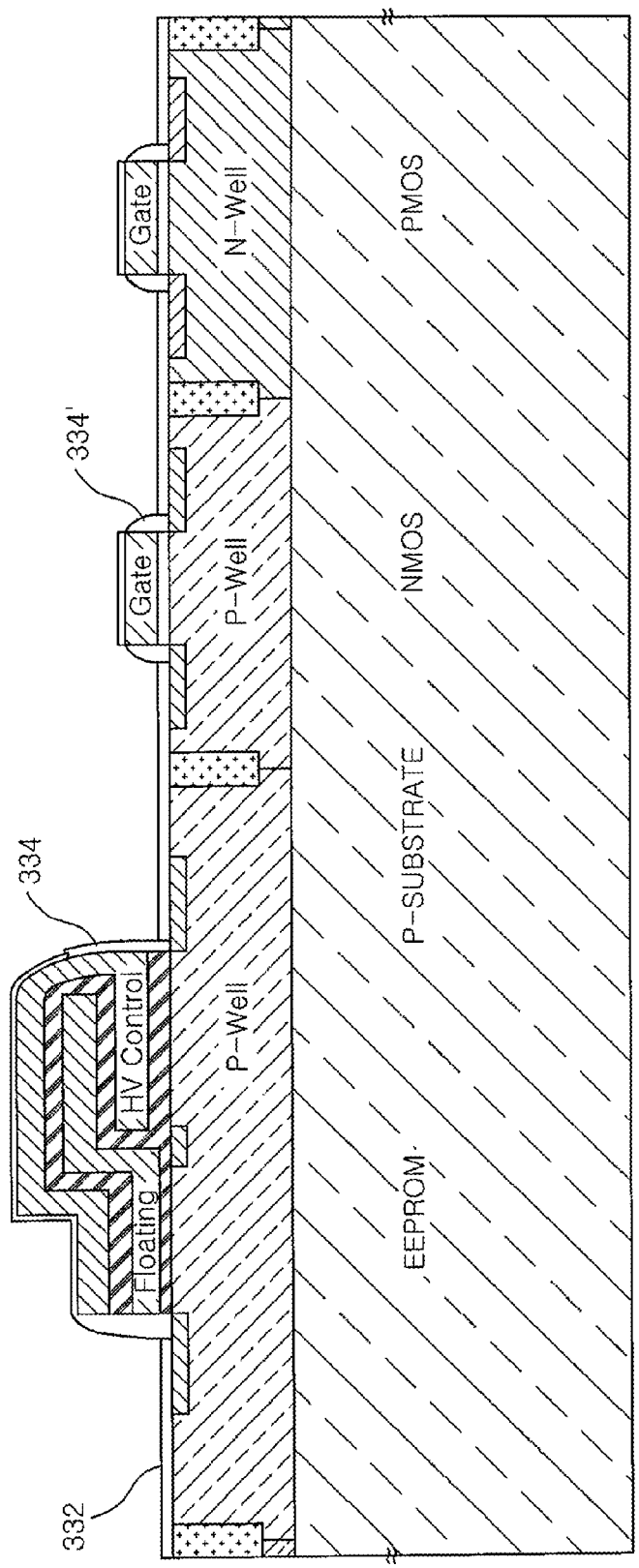

Next, as shown in FIG. 3I, an oxide film ($SiO_2$) or an oxynitride film (SiON) 332 is formed and etched perpendicular to respective gates of the EEPROM and CMOS to form sidewalls 334 and 334'. The sidewalls 334 and 334' function to increase insulating properties between the gate and the source/drain and between the metal terminals.

Figure 3J:
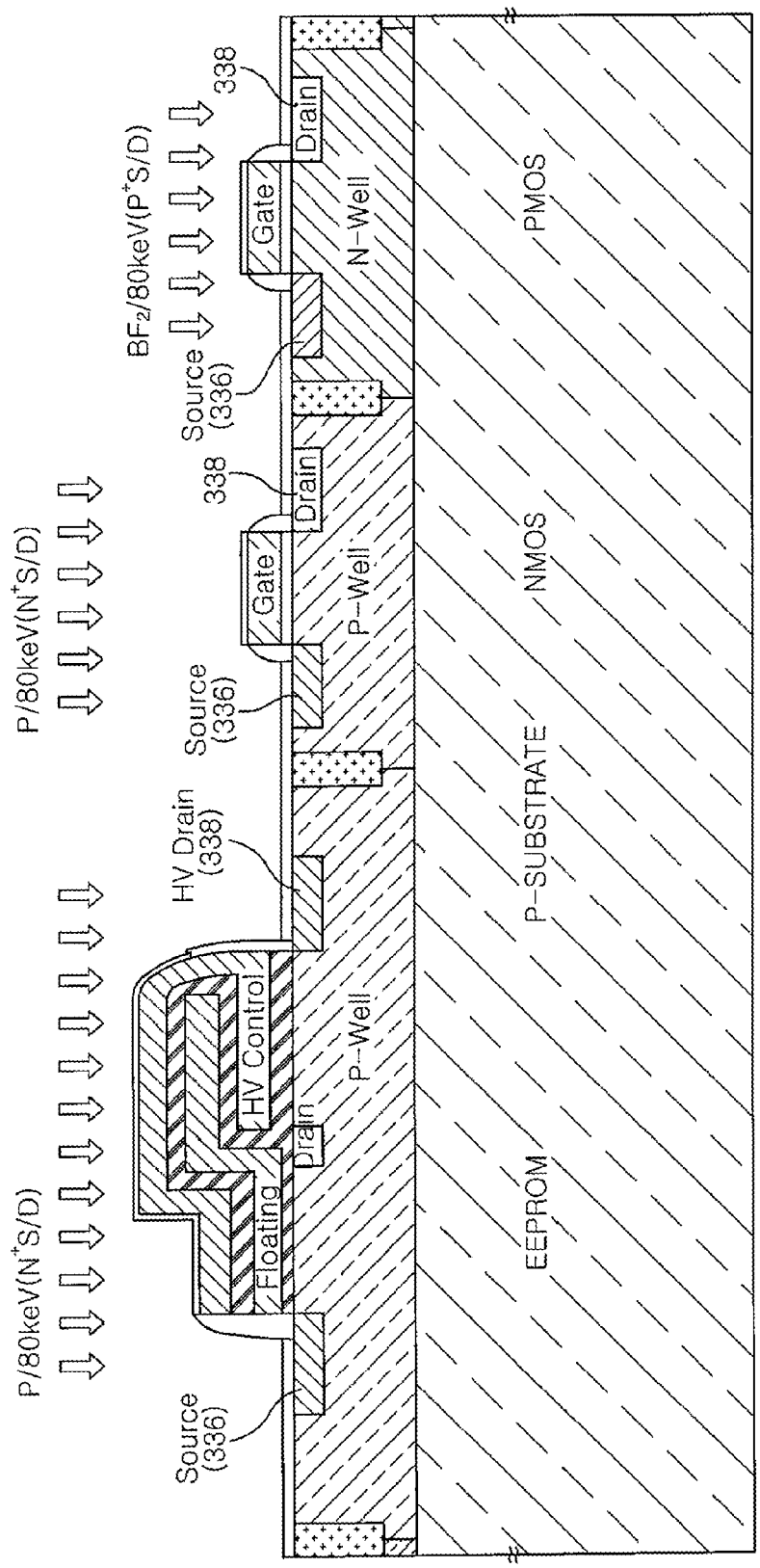

Next, as shown in FIG. 3J, in order to form sources and drains of the EEPROM, and the NMOS and the PMOS of the CMOS, corresponding regions of the EEPROM and CMOS are subjected to high-concentration ion implantation by using arsine (As) or phosphorus (P) and boron (B). Specifically, the EEPROM region and the NMOS region of CMOS are subjected to implantation of P ions with an energy of about 70 to 90 keV, preferably 80 keV, and the PMOS region of CMOS is subjected to implantation of $BF_2$ ions with an energy of 70 to 90 keV, preferably 80 keV, so that the sources 336 and the drains 338 are formed on the respective regions, as shown in FIG. 3J.

Figure 3K:
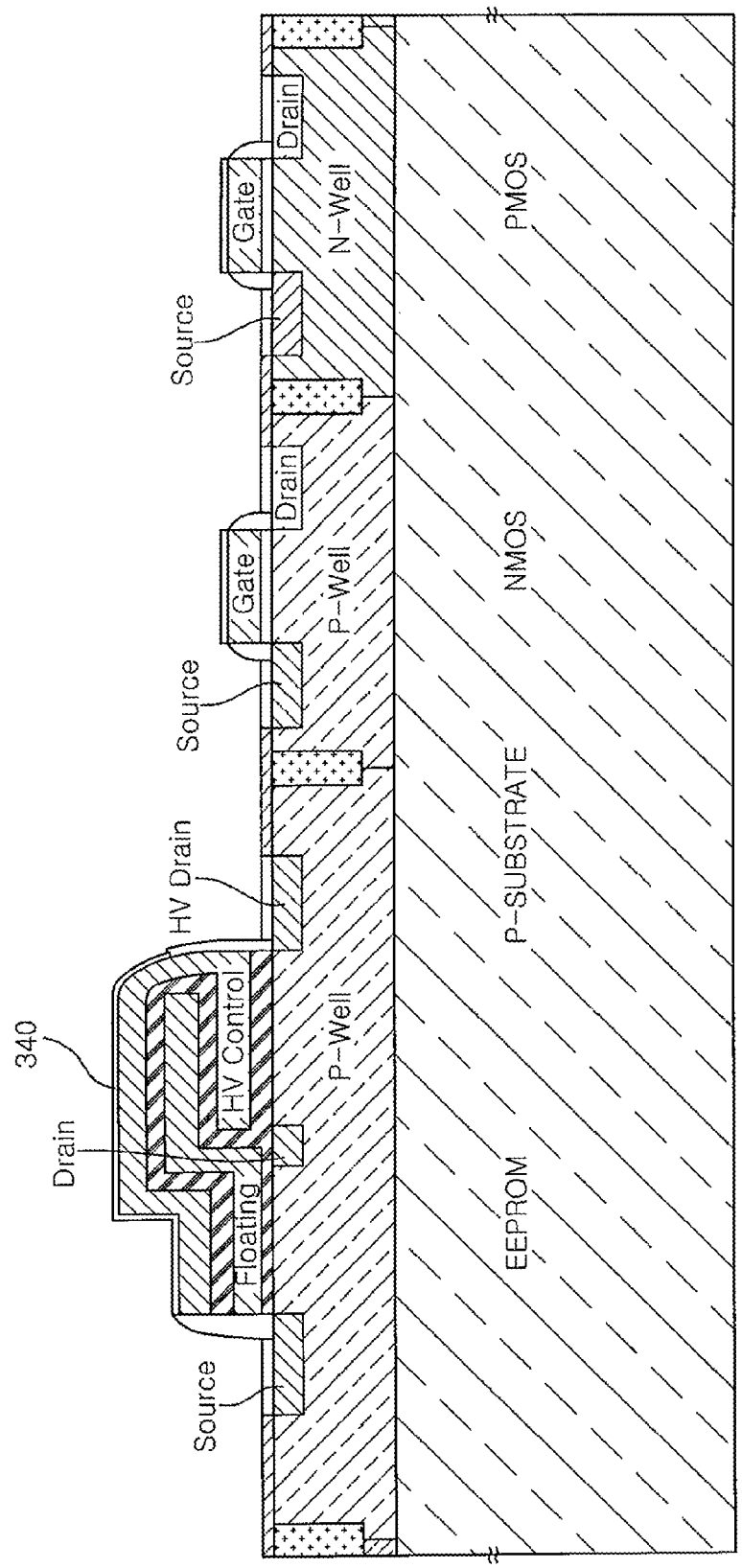

Next, as shown in FIG. 3K, in order to reduce resistance of the gate, source and drain regions of the EEPROM, a Ti/TiN layer 340 is formed on the gate, source and drain regions, is subjected to low-temperature rapid thermal processing, is wet-etched and then subjected to high-temperature thermal processing, so that the region where Si is exposed is selectively silicidized into a $TiSi_2$ film.

Figure 3L:
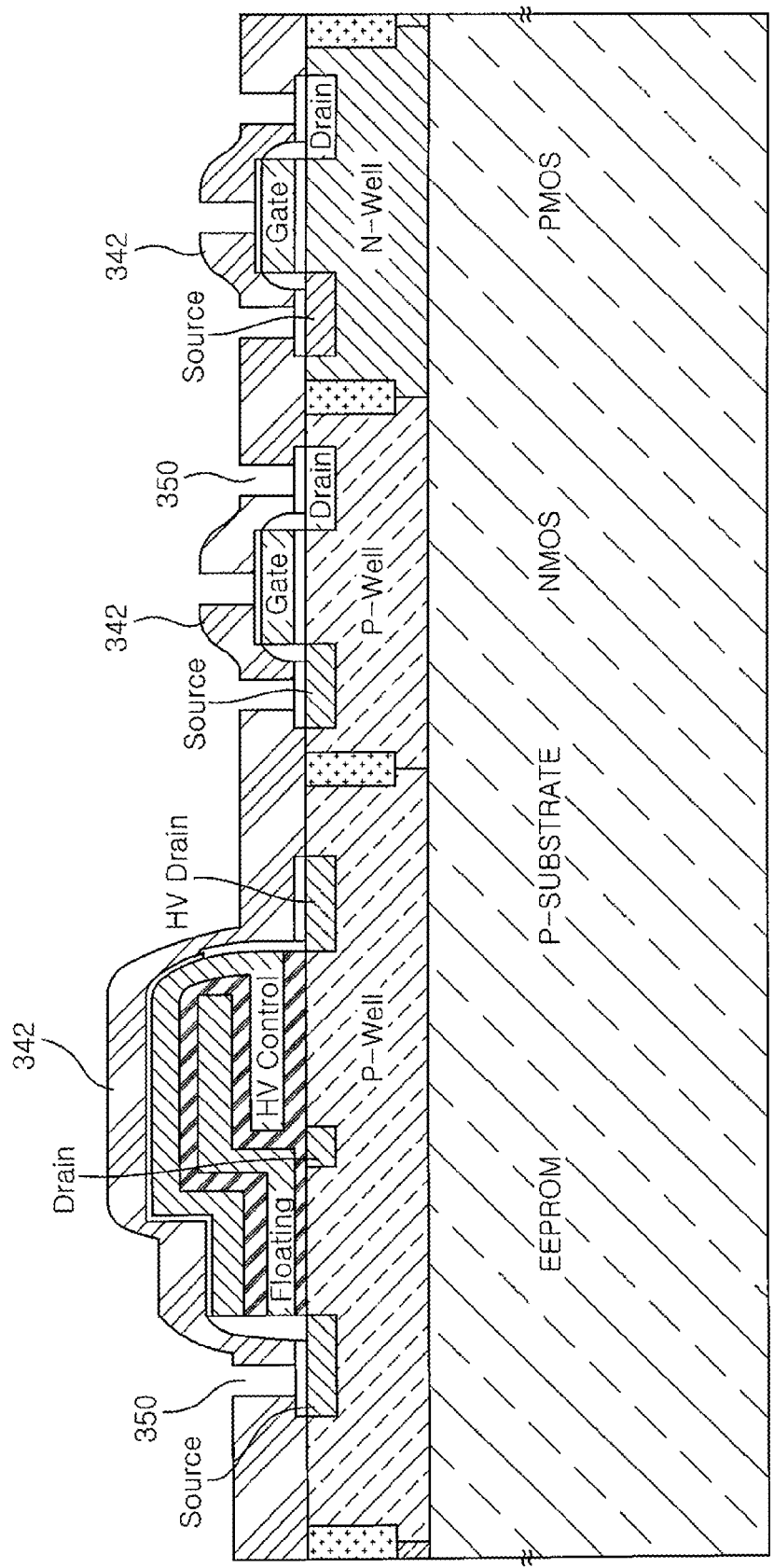

Then, as shown in FIG. 3L, before formation of metal wiring, an interlayer insulating oxide film 342 is formed, and contact holes 350 which are contact points between a semiconductor and a metal wiring layer is formed therein.

Figure 3M:
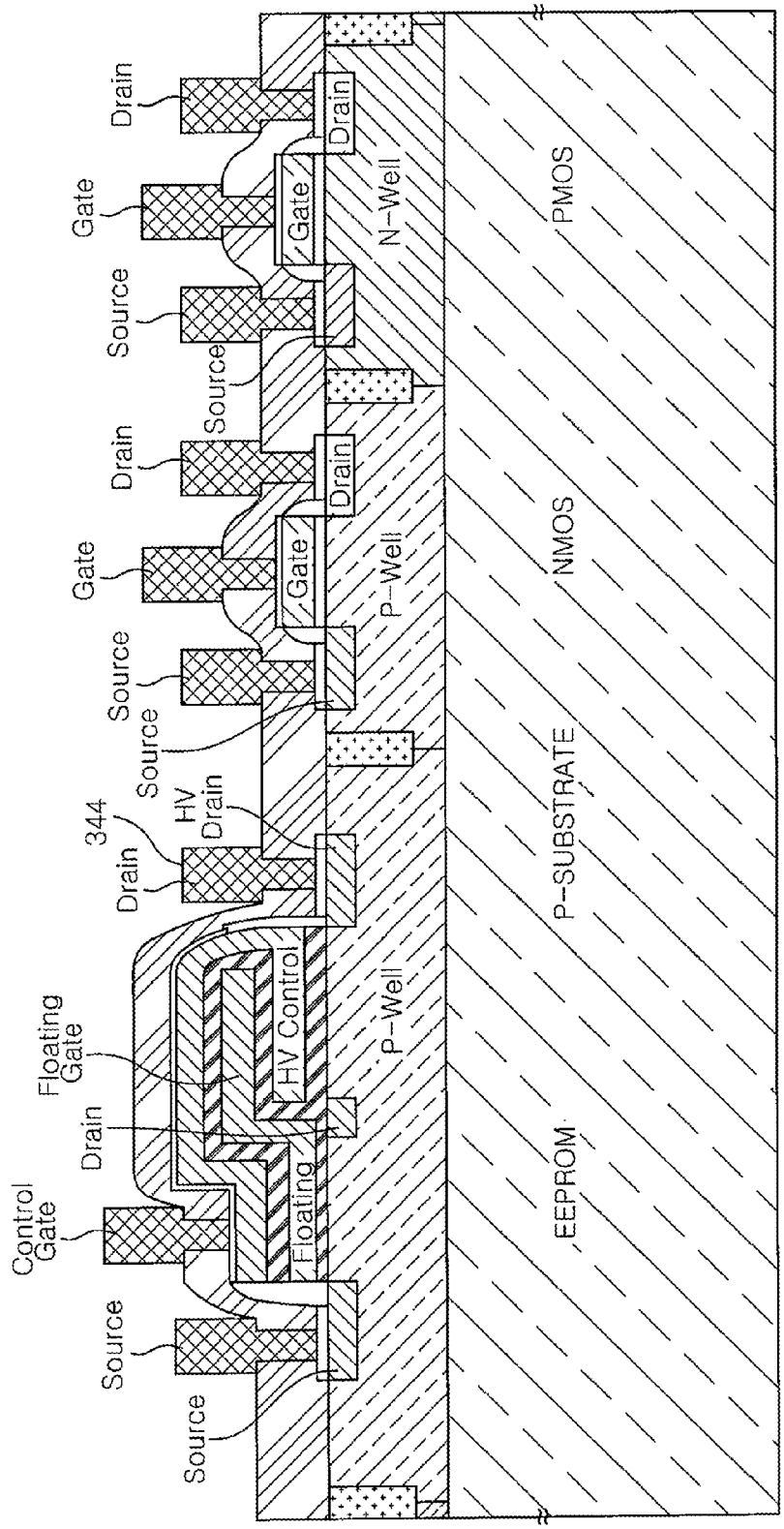

Thereafter, as shown in FIG. 3M, an Al/Ti/TiN layer 344 is formed, a photoresist is coated on the Al/Ti/TiN layer 344, and patterning is performed by exposure and development to thereby form metal wiring. With above-described processes the EEPROM manufacture is completed.

The subsequent processes after the process of FIG. 3M progress through a metal wiring forming process of a CMOS circuit, as necessary, without regard to the EEPROM.

In the embodiment of the present invention, the first polysilicon layer of the control gate 324 is horizontally connected in series to the drain of the floating gate 322 in silicon substrate channel which is the second polysilicon layer, and the first polysilicon layer of the control gate 314 is connected again to the third polysilicon layer of the control gate 328 to enclose the floating gate 322 which is the second polysilicon layer. With this, the control gates 314 and 328 enclose an entire surface of the floating gate 322 except for the tunnel surface of the floating gate 322, thus increasing the coupling ratio in the same area.

Further, the inner N+ doping layer 316 is provided between the floating gate 322 and the first polysilicon layer of the control gate 314, thus preventing the discontinuing of a channel connected in series between the floating gate 322 and the first polysilicon layer of the control gate 314 and facilitating the injection of electrons to the floating gate 322 using CHE (Channel Hot Electron) injection upon programming.

Upon programming, appropriate voltage is applied to the control gates 314 and 328 thus controlling the generation of excessive CHE current (e.g., about 300 μA or more). Upon erasing, even when the floating gate 322 is over-erased, the control gate transistor connected in series to the floating gate 322 is maintained in the off state without floating the drain of the floating gate 322, thereby preventing the generation of initial leakage current from the drain of the floating gate 322 to the source.

Table 1 below shows the operating conditions and features of the conventional device and the inventive device in accordance with the embodiment of the present invention with reference to FIGS. 3A to 3M.

TABLE 1

| | Operating Conditions | | Advantages | |
| --- | --- | --- | --- | --- |
| | Conventional (+10 V, −8 V) | Inventive (+12 V) | (low voltage, self-stability) | Note |
| Program | V(Source): 0 V<br>V(Drain): 5 V<br>V(Control gate): 10 V<br>V(Well bias): 0 V | V(Source): 0 V<br>V(Drain): 5 V<br>V(Control gate): 8 V<br>V(Well bias): 0 V | low-voltage program is possible by increase of coupling ratio over-program is prevented by control of V (control gate) | Cell area is larger (2-layer polysilicon -> 3-layer polysilicon) |
| Erasing | V(Source): Floating<br>V(Drain): Floating<br>V(Control gate): −8 V<br>V(Well bias): 10 V | V(Source): Do not Care<br>V(Drain): Do not Care<br>V(Control gate): 0 V<br>V(Well bias): 12 V | low-voltage program is possible by increase of coupling ratio self-stabilization is possible without additional control of V (Source), V (drain) | |
| Sensing | V(Source): 0 V<br>V(Drain): 1 V<br>V(Control gate): 3.5 V<br>V(Well bias): 0 V | V(Source): 0 V<br>V(Drain): 1 V<br>V(Control gate): 2.5 V<br>V(Well bias): 0 V | | |

As is apparent from Table 1, the EEPROM manufactured through the embodiment of the present invention enables the low-voltage operation and has high self-stability and is thus adapted for embedded SoC applications.

In accordance with the embodiment of the present invention, the coupling ratio is increased on the same area as in the conventional configuration so that low-voltage operation is possible upon programming/erasing. Also, a control gate connected in series to a floating gate is used to self-control the generation of excessive CHE current upon programming and to inhibit the generation of initial leakage current resulting from an over-erased state upon erasing, thus self-stabilizing the operation of the EEPROM.

While the invention has been shown and described with respect to the preferred embodiments, it will be understood by those skilled in the art that various changes and modifications may be made without departing from the spirit and scope of the invention as defined in the following claims.

What is claimed is:

1. An electrically erasable programmable read-only memory, comprising:
   a device isolation film disposed on a predetermined region of a semiconductor substrate to define active regions;
   a well layer including implanted ions disposed over a surface of the semiconductor substrate having the device isolation film;
   a first layer of a control gate comprising a gate oxide film and polysilicon layer disposed over an electrically erasable programmable read-only memory region including the well layer;
   a second layer of a floating gate horizontally disposed in series on the first layer of the control gate;
   a third layer of a control gate horizontally disposed on the second layer of the floating gate and connected to the first layer of the control gate to enclose the second layer of the floating gate;
   a lightly doped drain region formed through low-concentration ion implantation after forming the third layer of the contact gate;
   sidewalls disposed on sides of the floating gate and the control gates, and a source region and a drain region formed by implanting high-concentration ions in the lightly doped drain region;
   a Ti/TiN layer formed to reduce resistance of the control gates, the floating gate, the source region and the drain region; and
   an interlayer insulating oxide film on a surface of the semiconductor substrate where the Ti/TiN layer has been formed.

2. The memory of claim 1, further comprising an inner N+ doping layer disposed in an upper portion of the well layer and configured to control channel injection of the second layer of the floating gate during programming.

3. The memory of claim 1, wherein the device isolation film is a trench structure formed by forming an insulating film as a buffer film on the semiconductor substrate and patterning the insulating film to form a trench, which is then gap-filled with an oxide film.

4. The memory of claim 1, further comprising:
   a first dielectric film disposed on the first layer of the control gate; and
   a second dielectric film disposed on the second layer of the floating gate,
   wherein the second layer of the floating gate is disposed on a tunnel oxide film which is formed on a tunnel region after removing the first dielectric film from the tunnel region.

5. The memory of claim 4, wherein each of the first dielectric film and the second dielectric film includes a SiO2 film, a Si3N4 film and a SiO2 film, which are sequentially formed.

6. The memory of claim 4, wherein boron ions are implanted into the first dielectric film to control a threshold voltage of the second layer of the floating gate.

7. The memory of claim 1, wherein the third layer of the control gate is formed of polysilicon while forming a gate on the gate oxide film of a complementary metal-oxide semiconductor region in the p-type semiconductor substrate.

8. A method for manufacturing an electrically erasable programmable read-only memory, comprising:
   forming a device isolation film on a p-type semiconductor substrate;
   forming a well layer on a surface of the p-type semiconductor substrate having the device isolation film through ion implantation;
   sequentially forming a gate oxide film and polysilicon on an electrically erasable programmable read-only memory region having the well layer, and patterning them to thereby form a first layer of a control gate;
   forming a second layer of a floating gate to be horizontally disposed on the first layer of the control gate;
   forming a third layer of the control gate to be horizontally disposed on the second layer of the floating gate;
   connecting the first layer of the control gate and the third layer of the control gate to each other to enclose the second layer of the floating gate;
   forming a lightly doped drain region through low-concentration ion implantation after forming the third layer of the control gate;
   forming sidewalls of the control gates and the floating gate and forming a source region and a drain region by implanting high-concentration ions to the lightly doped drain region;
   forming a Ti/TiN layer to reduce resistance of the control gates, the floating gate, the source region and the drain region;
   forming an interlayer insulating oxide film on a surface of the p-type semiconductor substrate where the Ti/TiN layer has been formed; and
   forming a metal wiring via a contact hole of the interlayer insulating oxide film.

9. The method of claim 8, wherein said forming the device isolation film is performed by forming an insulating film as a buffer film on the p-type semiconductor substrate, patterning the insulating film to a trench, and gap-filling the trench.

10. The method of claim 8, further comprising, before forming the interlayer insulating oxide film, performing low-temperature rapid thermal processing on the Ti/TiN layer, performing wet etching, and performing high-temperature thermal processing to thereby form a silicide layer.

11. The method of claim 8, further comprising, after forming the first layer of the control gate, forming an inner N+ doping layer through inner N+ ion implantation to control channel injection the second layer of the floating gate during programming.

12. The method of claim 8, further comprising:
   forming a high-voltage gate oxide film on a surface of the electrically erasable programmable read-only memory region on which the well layer has been formed;
   forming polysilicon on the high-voltage gate oxide film, and patterning it to form the first layer of the control gate;
   forming a first dielectric film on the first layer of the control gate; and
   forming a second dielectric film on the second layer of the floating gate.

13. The method of claim 12, wherein the second layer of the floating gate is formed on a tunnel oxide film which is formed on a tunnel region after removing the first dielectric film from the tunnel region.

14. The method of claim 12, wherein each of the first dielectric film and the second dielectric film includes a first SiO2 film, a Si3N4 film and a second SiO2 film, which are sequentially formed.

15. The method of claim 12, further comprising, before forming the second dielectric film, performing implantation of boron ions into the first dielectric film to control a threshold voltage of the second layer of the floating gate.

16. The method of claim 8, wherein the third layer of the control gate is formed of polysilicon while forming a gate on the gate oxide film of a complementary metal-oxide semiconductor region in the p-type semiconductor substrate.

* * * * *